United States Patent [19]
Lin et al.

[11] Patent Number: 6,121,132
[45] Date of Patent: Sep. 19, 2000

[54] METHOD FOR REDUCING STRESS ON COLLIMATOR TITANIUM NITRIDE LAYER

[75] Inventors: Chi-Rong Lin, Chang Hua Hsien; Horng-Bor Lu, Hsinchu, both of Taiwan

[73] Assignee: United Microelectronics Corp., Hsinchu, Taiwan

[21] Appl. No.: 08/941,087

[22] Filed: Sep. 30, 1997

[30] Foreign Application Priority Data

Jul. 22, 1997 [TW] Taiwan ................................. 86110388

[51] Int. Cl.⁷ ................................. H01L 21/4763
[52] U.S. Cl. ..................... 438/627; 438/637; 438/643; 438/644; 438/648; 438/653; 438/654; 438/656; 438/680; 438/685; 438/785
[58] Field of Search ..................... 438/627, 637, 438/643, 644, 648, 653, 654, 656, 680, 685, 785

[56] References Cited

U.S. PATENT DOCUMENTS 5,627,102  5/1997  Shinriki et al. ..................... 437/192
5,763,948  6/1998  Sumi ..................... 257/763

*Primary Examiner*—John F. Niebling
*Assistant Examiner*—David A Zarneke
*Attorney, Agent, or Firm*—Rabin & Champagne, P.C.

[57] ABSTRACT

A method for reducing the stress on a titanium nitride layer formed by collimator sputtering. On a semiconductor substrate, an insulated oxide layer is formed. A trench is formed in the insulated oxide layer. On the trench, a first titanium nitride layer is formed conformally by using physical or chemical vapor deposition as a buffer layer. A second titanium nitride layer is formed by collimator sputtering on the first titanium layer. The orientation of lattice arrangement of the second titanium nitride layers is changed from <100>-orientation to <111>-orientation, and therefore, the stress is reduced.

9 Claims, 2 Drawing Sheets

METHOD FOR REDUCING STRESS ON COLLIMATOR TITANIUM NITRIDE LAYER

BACKGROUND OF THE INVENTION

1. Field of the Invention

The invention relates to a method for reducing the stress on a titanium nitride layer, and more particular to a method for reducing stress on a titanium nitride layer deposited by collimator sputtering, and improving a peeling problem in the subsequent processing.

2. Description of the Related Art

In the semiconductor fabricating process, the sputtering technique is very important for the formation of a variety of metal layers, especially an aluminum alloy or a barrier layer. However, the disadvantage of the conventional sputtering method is that the step coverage of a film deposited by sputtering is poor. As the integration of semiconductor devices grows higher and higher, this problem becomes more serious. Thus, another method of sputtering, that is, a collimator sputtering technique, is proposed. The collimator sputtering provides a good step coverage on the bottom of a trench structure for depositing a film. To apply collimator sputtering technique in metal layer deposition, the geometry design can reach to 0.35 µm to 0.25 µm. However, compared to the conventional sputtering method, the stress on titanium nitride formed by collimator sputtering is much larger.

Referring to FIG. 1, a cross-sectional view of a convention method for depositing a titanium nitride by the collimator sputtering technique is illustrated. A collimator 12 is positioned between a metal target 10 and a substrate 11. The substrate 11 comprises a trench structure 14, and a titanium nitride layer 16 is formed by aligning the collimator 12 with the trench 14. The profile of the collimator 12 has a cellular structure and is composed by several hexagonal tubes. The path angle of the atom beam sputtered from the metal target has to be small enough to pass through the collimator 12 and to reach the surface of the substrate 11. Therefore, using the collimator 12 can filter out the large angle sputtered deposition. Obviously, the deposited titanium nitride layer 16 deposited on the bottom of the trench 14 has a better step coverage than by using a conventional sputtering method.

However, the metal layer, for example, a titanium layer, formed by the collimator sputtering technique has a preferred orientation, such as <100>-orientation of lattice arrangement no matter by it is a barrier layer or an adhesion layer. Thus, the titanium nitride layer lattice has an identical arrangement orientation, and therefore, a larger stress. For example, the stress on a titanium nitride layer with a thickness of about 600 Å is about $-1.64E10Nt/m^2$, while the stress on a titanium nitride layer with a thickness is about 800 Å is about $-1.25E10Nt/m^2$.

SUMMARY OF THE INVENTION

It is therefore an object of the invention to provide a method for reducing the stress on a collimator titanium nitride layer, and to improve the peeling problem in subsequent processing.

To achieve these objects and advantages, and in accordance with the purpose of the invention, as embodied and broadly described herein, the invention is directed towards a method for reducing the stress on a collimator sputtered titanium nitride layer. A semiconductor substrate on which a trench is formed is provided. An insulated oxide layer is formed over the substrate. A trench is formed in the insulated oxide layer, and a conformal first titanium nitride layer is formed on the trench. The method used for forming the first titanium nitride layer is conventional physical vapor deposition or chemical vapor deposition instead of collimator technique. A second titanium nitride layer is formed by collimator sputtering on the first titanium nitride layer. The orientation of the second titanium nitride formed by collimator sputtering would be changed from <100>-orientation to <111>-orientation, thus, the stress is reduced.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate an embodiment of the invention and together with the description, serve to explain the principles of the invention. In the drawings.

DESCRIPTION OF THE PREFERRED EMBODIMENTS

Figure 1:
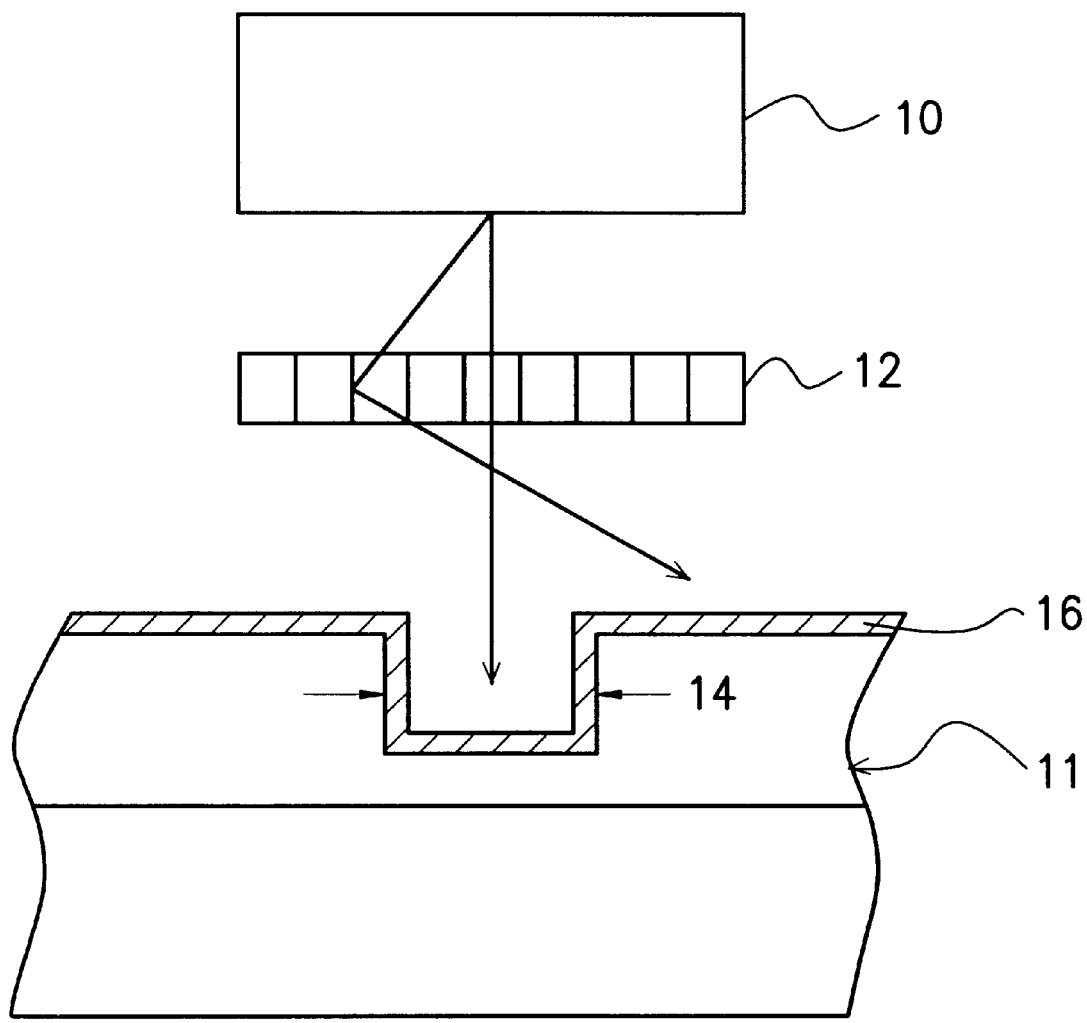
FIG. 1 is a cross-sectional view which shows a conventional collimator sputtering method to deposit a titanium nitride layer with <100>-orientation; and FIG. 2A to FIG. 2C is a cross-sectional view which shows the flow chart of the method for reducing the stress on a titanium nitride layer in a preferred embodiment according to the invention.
Figure 2A:
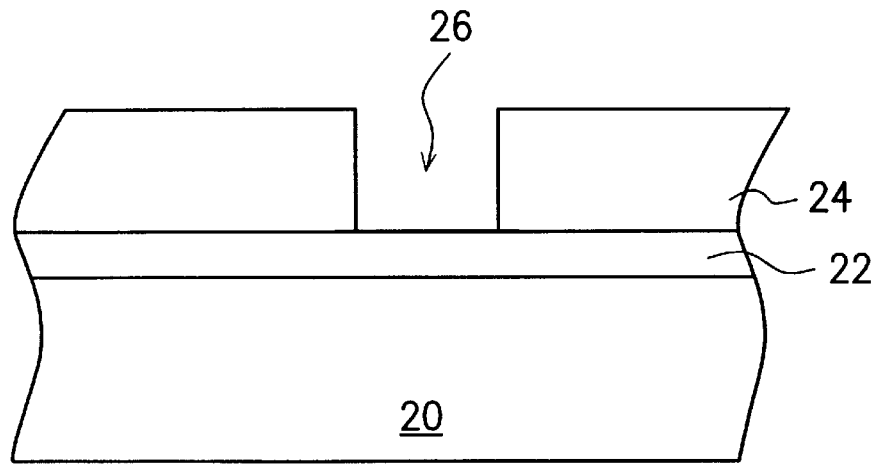
Figure 2B:
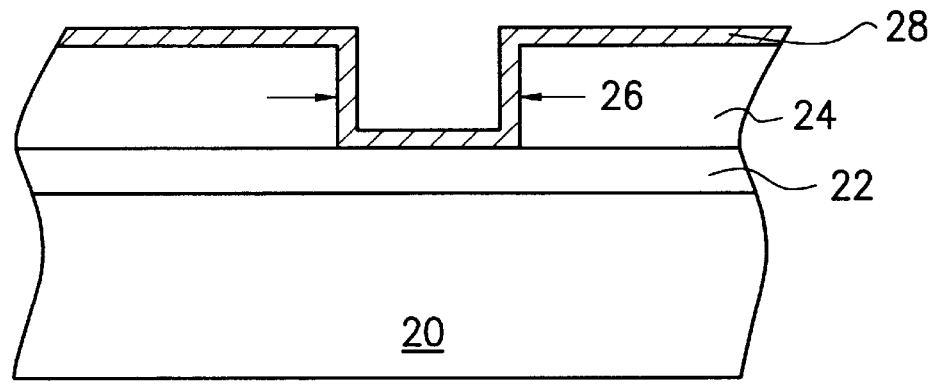
Figure 2C:
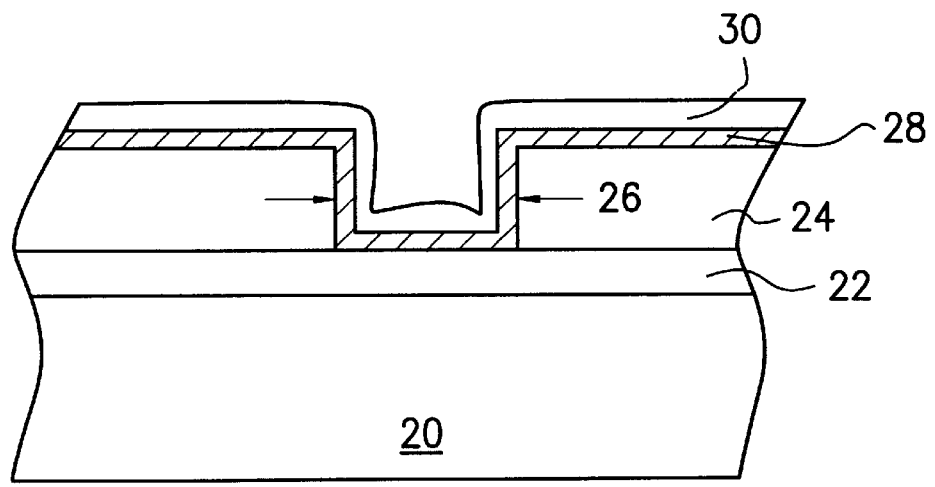

Referring to FIG. 2A to FIG. 2C, a cross sectional view of a method for reducing the stress on a titanium nitride layer formed by collimator sputtering in a preferred embodiment according to the invention is shown.

Referring to FIG. 2A, a semiconductor substrate 20 is provided. The semiconductor substrate 20 comprises a variety of device structures. A device layer 22 is adopted here in the embodiment. An oxide layer 24 is formed on the device layer 22. The thickness of the oxide layer is about 5000 Å. The oxide layer 24 is etched to form a trench 26.

Referring to FIG. 2B, a first titanium nitride layer 28 is deposited conformally on the trench 26 as a buffer layer. The method used to form the first titanium nitride layer 28 is a conventional deposition way, for example, physical vapor deposition or any kind of chemical vapor deposition, such as low pressure chemical vapor deposition. The thickness of the first titanium nitride layer 28 is about 10 Å to 500 Å. The deposition temperature is about 20° C. to 600° C. It is to be noted that the deposition of the first titanium nitride layer is formed by non-collimator sputtering technique, and thus, the orientation of the lattice arrangement is different, then that formed by such as <111>.

Referring to FIG. 2C, using collimator sputtering, a second titanium nitride layer 30 is formed on the first titanium nitride layer 28. The thickness of the second titanium nitride layer is about 100 Å to 1000 Å, and the orientation of the lattice arrangement in the second titanium nitride layer is changed from <100> to <111>; and. By changing the orientation of the lattice arrangements for the second titanium nitride layer, that is, to have the <111>-orientation for the first titanium nitride layer 28 and the <111>-orientation for the second titanium nitride layer 30, the stress on the lamination of these two titanium nitride layers can be reduced effectively. Moreover, the peeling problem can be easily improved.

The resulting data of the invention is presented as follows. While the thickness of the first and the second titanium nitride layers 28 and 30 is about 200 Å and 600 Å, respectively, the stress is about −6.0E9Nt/m². Compared to the stress on the titanium nitride layer formed by a conventional collimator sputtering technique, the stress on the titanium nitride layer in the embodiment is reduced at lease an order.

As a conclusion, the advantages of method for reducing the stress on the titanium nitride layer by collimator according to the invention are:

(1) The stress on the titanium nitride layer is reduced to about −6.0E9Nt/m² in the invention. It is obviously much lower than the results from a conventional method. Therefore, the peeling problem during a subsequent tungsten metal deposition process is easily to improved.

(2) Due to the different orientations for different titanium nitride layers, the stress is reduced and the technique and the application of collimator sputtering is enhanced.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for reducing stress on a titanium nitride layer, comprising:

providing a semiconductor substrate having an insulating oxide layer thereon;

forming an opening in the oxide layer;

forming a first titanium nitride layer on the oxide layer and within the opening, wherein the first titanium nitride layer has a lattice arrangement of an orientation <111>; and forming a second titanium nitride layer on the first titanium nitride layer using collimator sputtering, so as to have a lattice arrangement that adopts the <111> orientation of the first titanium nitride layer.

2. The method according to claim 1, wherein the first titanium nitride layer has a thickness of about 10 Å to 500 Å.

3. The method according to claim 1, wherein the first titanium nitride layer is formed within the opening by chemical vapor deposition.

4. The method according to claim 1, wherein the first titanium nitride layer is formed by low pressure chemical vapor deposition.

5. The method according to claim 1, wherein the second titanium nitride layer has a thickness of about 10 Å to 1000 Å.

6. The method according to claim 1, wherein the first titanium nitride layer is formed on the oxide layer and within the opening, by non-collimator sputtering.

7. The method according to claim 6, wherein the first titanium nitride layer is formed by chemical vapor deposition.

8. A method of reducing stress on a titanium nitride layer, comprising:

forming an insulating oxide layer on a semiconductor substrate;

forming a trench in the oxide layer;

forming a first titanium nitride layer on the oxide layer and within the trench, wherein the first titanium nitride layer has a lattice arrangement of an orientation <111>; and forming a second titanium nitride layer on the first titanium nitride layer, using collimator sputtering, so as to have a lattice arrangement that adopts the <111> orientation of the first titanium nitride layer.

9. The method according to claim 8, wherein the first titanium nitride layer is formed by chemical vapor deposition.

* * * * *